United States Patent [19]
Shah et al.

[11] Patent Number: 5,918,112
[45] Date of Patent: Jun. 29, 1999

[54] SEMICONDUCTOR COMPONENT AND METHOD OF FABRICATION

[75] Inventors: Mahesh K. Shah, Scottsdale; John W. Hart, Jr., Mesa, both of Ariz.

[73] Assignee: Motorola, Inc., Schaumburg, Ill.

[21] Appl. No.: 08/899,672

[22] Filed: Jul. 24, 1997

[51] Int. Cl.⁶ .................................................. H01L 21/44
[52] U.S. Cl. .................... 438/107; 438/124; 438/126; 438/127
[58] Field of Search .................... 438/108, 107, 438/112, 123, 124, 125, 126, 127; 257/723, 724, 725, 790

[56] References Cited

U.S. PATENT DOCUMENTS

| | | |
|---|---|---|
| 5,096,852 | 3/1992 | Hobson . |
| 5,227,995 | 7/1993 | Klink et al. . |
| 5,352,632 | 10/1994 | Sawaya . |
| 5,381,039 | 1/1995 | Morrison . |
| 5,395,800 | 3/1995 | Maruyama . |
| 5,504,370 | 4/1996 | Lin et al. . |
| 5,523,608 | 6/1996 | Kitaoka et al. ........................ 257/723 |
| 5,523,617 | 6/1996 | Asanasavest . |
| 5,533,256 | 7/1996 | Call et al. ............................... 438/127 |
| 5,607,883 | 3/1997 | Bhattacharyya et al. ............... 438/125 |
| 5,696,032 | 12/1997 | Phelps, Jr. et al. ..................... 438/108 |
| 5,796,164 | 8/1998 | McGraw et al. ........................ 257/723 |
| 5,796,165 | 8/1998 | Yoshikawa et al. .................... 257/723 |

*Primary Examiner*—Kevin M. Picardat
*Attorney, Agent, or Firm*—George C. Chen

[57] ABSTRACT

A semiconductor component includes a leadframe (10), an electronic component (21) mounted over the leadframe (10), a packaging material (23) around the electronic component (21) and the leadframe (10) wherein the packaging material has a recess (24), another electronic component (30) in the recess (24), and a cap (32) over the recess (24) and the other electronic component (30). The other electronic component (30) is electrically coupled to the electronic component (21) through internal leads (13) and (14) of the leadframe (10). After a dam bar (15) is removed from the leadframe (10), the internal leads (13) are physically and electrically isolated from other portions of the leadframe (10) including the external leads (12) and the flag (11).

6 Claims, 3 Drawing Sheets

SEMICONDUCTOR COMPONENT AND METHOD OF FABRICATION

BACKGROUND OF THE INVENTION

This invention relates, in general, to semiconductor components, and more particularly, to semiconductor components having a plurality of electronic chips.

With the increased market demand for smaller semiconductor components and with the growth of the sensor market, there is a need for packaged sensor chips having increased accuracy and functionality. Accordingly, integrated circuits and sensors have been combined onto a single chip.

However, in certain applications, it is desirable to have the sensing chip separate from the integrated circuit chip for functionality, reliability, safety, or manufacturability concerns. Therefore, a need exists for a multi-chip semiconductor component having increased sensor functionality and accuracy.

DETAILED DESCRIPTION OF THE DRAWINGS

Figure 1:
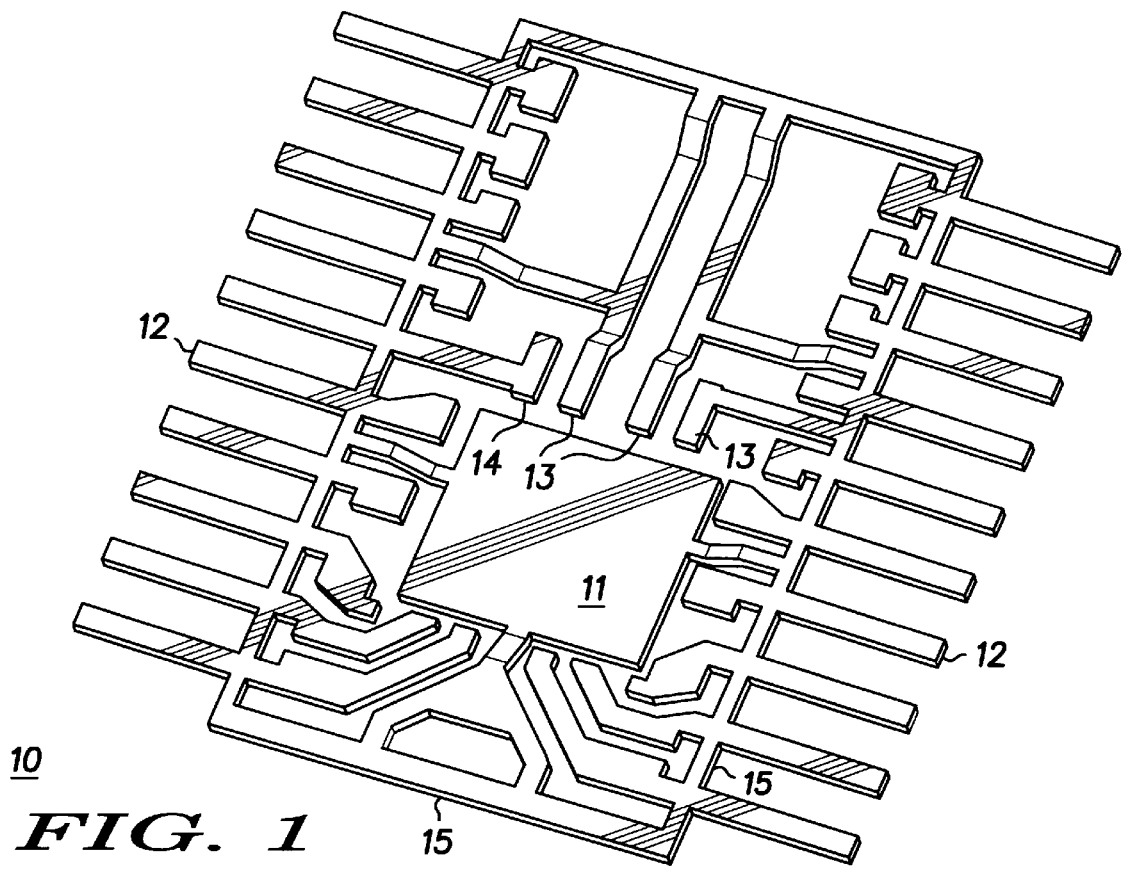
FIG. 1 illustrates an isometric view of an embodiment of a leadframe in accordance with the present invention.

FIG. 1 illustrates an isometric view of a substrate or leadframe 10. Leadframe 10 can be any substrate used to support a plurality of electronic chips such as, for example, semiconductor devices or the like. Leadframe 10 is preferably comprised of a copper alloy, but can alternatively be comprised of a ceramic substrate with copper tracings or the like. In the preferred embodiment, leadframe 10 has a mounting portion or flag 11 for supporting an electronic chip. In an undepicted alternative embodiment, leadframe 10 is a flag-less leadframe that does not have flag 11.

Leadframe 10 also has a plurality of external leads 12 and interior portions, tabs, posts, or internal leads 13 and 14. Leads 13 and 14 and flag 11 are all attached to a dam bar 15, which is excised prior to electrical testing. When dam bar 15 is removed from leadframe 10, internal leads 13 are physically and electrically isolated from each other and from other portions of leadframe 10 including external leads 12 and flag 11. However, even after the removal of dam bar 15, internal lead 14 is still electrically coupled to one of the external leads 12.

Figure 2:
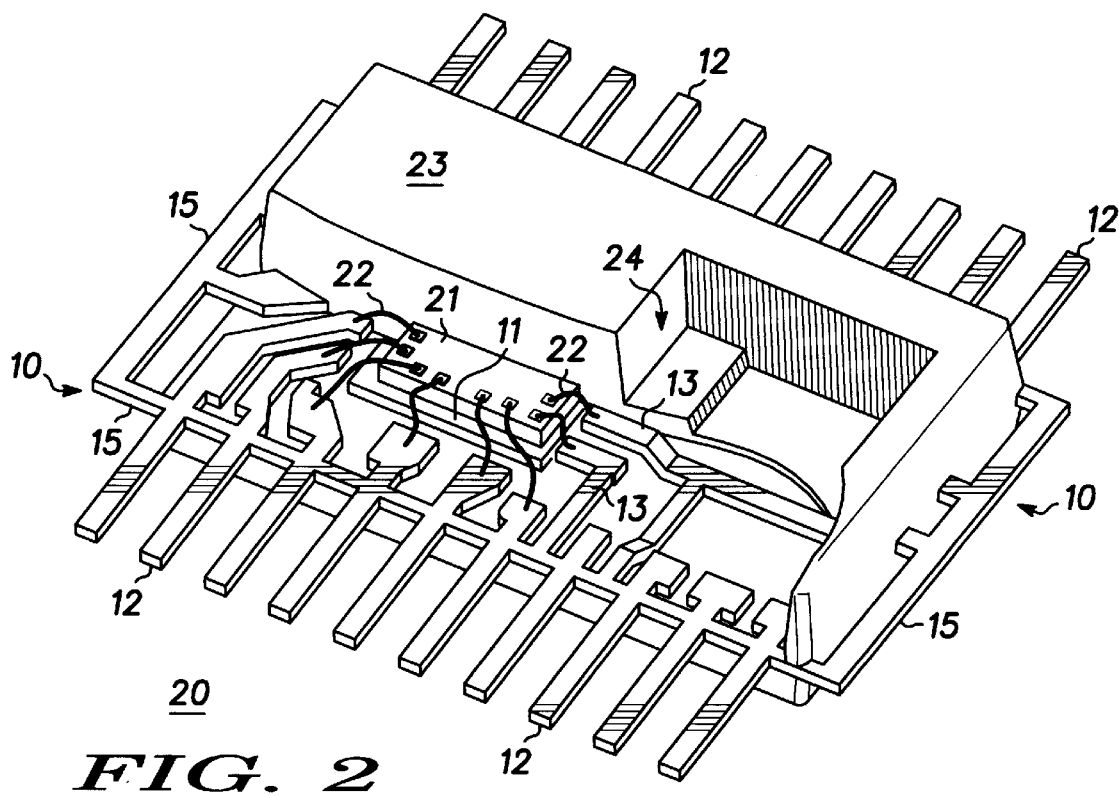
FIG. 2 portrays a cut-away isometric view of an embodiment of a semiconductor component at an intermediate stage of fabrication in accordance with the present invention.

FIG. 2 portrays a cut-away isometric view of a semiconductor component 20 at an intermediate stage of fabrication. The same reference numerals are used in the figures to denote the same elements. Component 20 includes leadframe 10 and an electronic device or component 21, which is disposed over, disposed adjacent to, mounted on, or aligned to a surface of flag 11. Component 21 could be a sensor or the like. However, in the preferred embodiment, component 21 is an integrated circuit on a semiconductor chip.

Component 21 is electrically coupled to external leads 12 and to internal leads 13 and 14 of leadframe 10. In the preferred embodiment, a plurality of wire bonds 22 provide the electrical coupling. However, tape-automated-bonding (TAB) or flip-chip bonding techniques could also be used to provide the electrical coupling. If flip-chip bonding were used, then the step of mounting component 21 over leadframe 10 would inherently include the electrical coupling step.

After the electrical coupling step, an encapsulant or packaging material 23 is disposed over or around component 21, wire bonds 22, and leadframe 10. External leads 12 protrude out of or beyond a perimeter of packaging material 23. Material 23 is used to protect component 21 and wire bonds 22 from moisture, corrosion, contamination, physical impact, or the like. Material 23 can be a plastic or metal lid or cover, especially when leadframe 10 comprises a ceramic substrate, but material 23 is preferably a high pressure injection molded encapsulant or the like. Material 23 is formed to have a recess 24, and a portion or internal leads 13 and 14 are exposed within recess 24. Leads 13 and 14 protrude or extend out of an inner portion of packaging material 23. Leads 13 and 14 may extend slightly beyond the perimeter of packaging material 23 because of the presence of manufacturing anomalies such as, for example, flash or tolerance problems. However, leads 13 and 14 preferably do not extend beyond the perimeter of packaging material 23.

Figure 3:
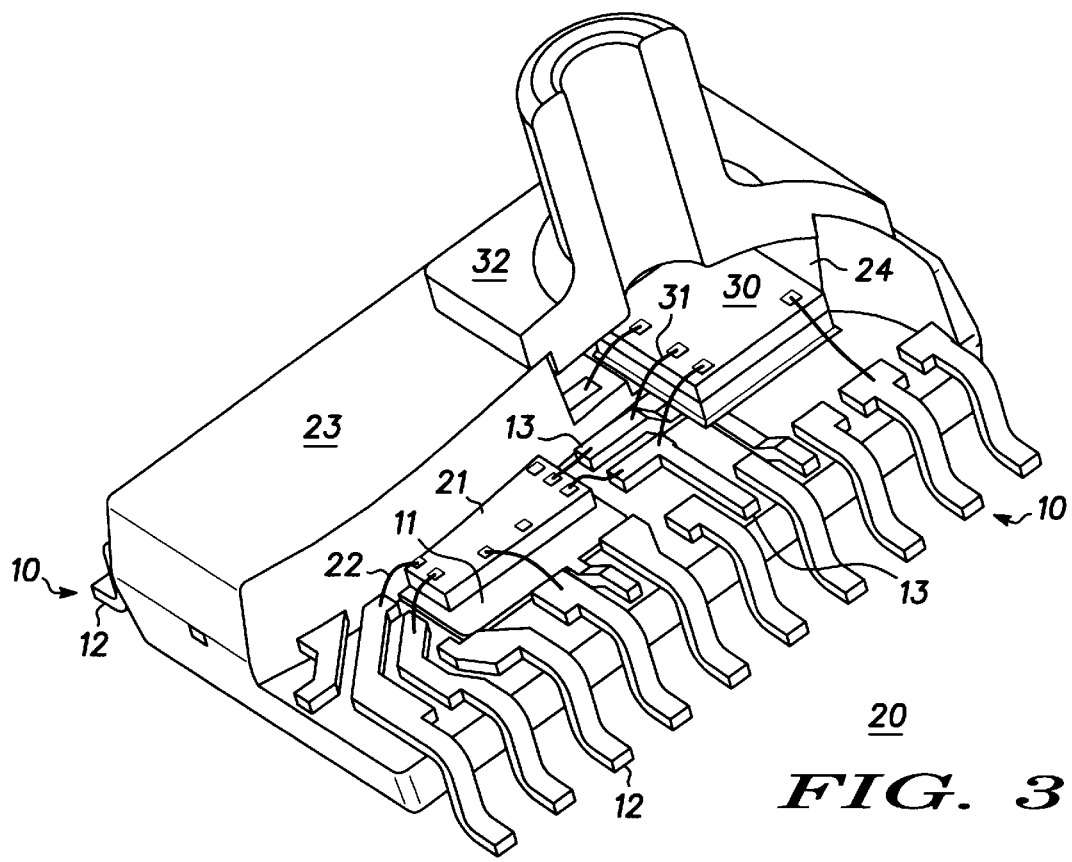
FIG. 3 depicts a cut-away isometric view of an embodiment of the semiconductor component after a subsequent stage of fabrication in accordance with the present invention.

FIG. 3 depicts a cut-away isometric view of semiconductor component 20 after a subsequent stage of fabrication. An electronic device or component 30 is disposed, aligned, or mounted within recess 24. Components 30 and 21 are located over the same surface of leadframe 10. Component 30 can be similar to component 21, but component 30 is preferably a sensor including, but not limited to, a chemical sensor, a pressure sensor, a temperature sensor, or an accelerometer. Alternatively, component 30 could be a surface acoustic wave (SAW) device. Component 30 is not encapsulated by packaging material 23 because component 30 is added to component 20 after the step of providing material 23. In the preferred embodiment illustrated in FIG. 3, material 23 supports and contacts component 30. However, in an undepicted alternative embodiment, component 30 can be mounted directly on a flag portion of leadframe 10 that is exposed within recess 24.

Next, component 30 is electrically coupled to external leads 12 and to internal leads 13 and 14 of leadframe 10. Component 30 is electrically coupled to component 21 through internal leads 13 and 14. In the preferred embodiment, a plurality of wire bonds 31 provide the electrical coupling. However, TAB or flip-chip bonding techniques could also be used to provide the electrical coupling. If flip-chip bonding were used, then the step of mounting component 30 over leadframe 10 would inherently include the electrical coupling step.

Therefore, if components 30 and 21 are a sensor and an integrated circuit, respectively, then component 21 can be used for signal processing and signal conditioning to increase the sensor functionality and accuracy of component 20. Component 20 eliminates the need to use two separately packaged components to accomplish the increased sensor functionality and accuracy. When component 21 is a controller chip and when component 30 is a chemical sensor that operates at elevated temperatures, component 20 provides improved reliability, accuracy, and functionality over the prior art because component 21 is physically separated from component 30 and is not detrimentally affected by the high operation temperature of component 30.

A cap 32 is then disposed over component 30 to at least provide protection for component 30. As an example, cap 32 can be comprised of a metal or plastic lid covering recess 24 and component 30. Cap 32 can be hermetically sealed, if desired. Cap 32 can have a filter if component 30 is a chemical sensor, or cap 32 can have a port if component 30 is a pressure sensor. Cap 32 can also be comprised of a gel-type material and a lid wherein the gel-type material is in recess 24 and around component 30 and wherein the lid overlies recess 24 and is with or without a port. Alternatively, cap 32 can consist solely of a gel or glob-top material if component 30 is a capped accelerometer. Cap 32 can also consist of a solid protective lid when component 30 is a SAW device or some other sensor device.

To facilitate the manufacturing of component 20, cap 32 preferably does not cover or overlie component 21, which is sufficiently protected by packaging material 23. Alternatively, cap 32 can cover both components 21 and 30, and cap 32 can even replace packaging material 23 in some instances. However, when component 30 is a chemical or pressure sensor and when cap 32 includes a port, packaging material 23 is preferably still used as illustrated in FIG. 3 because it provides more protection for component 21 than if both electronic components 21 and 30 were only covered by a single cap.

After the capping process, dam bar 15 is excised or removed from leadframe 10 and component 20, and external leads 12 are bent. Alternatively, dam bar 15 can be removed and leads 12 can be bent after the encapsulation process but before the mounting of component 30.

Figure 4:
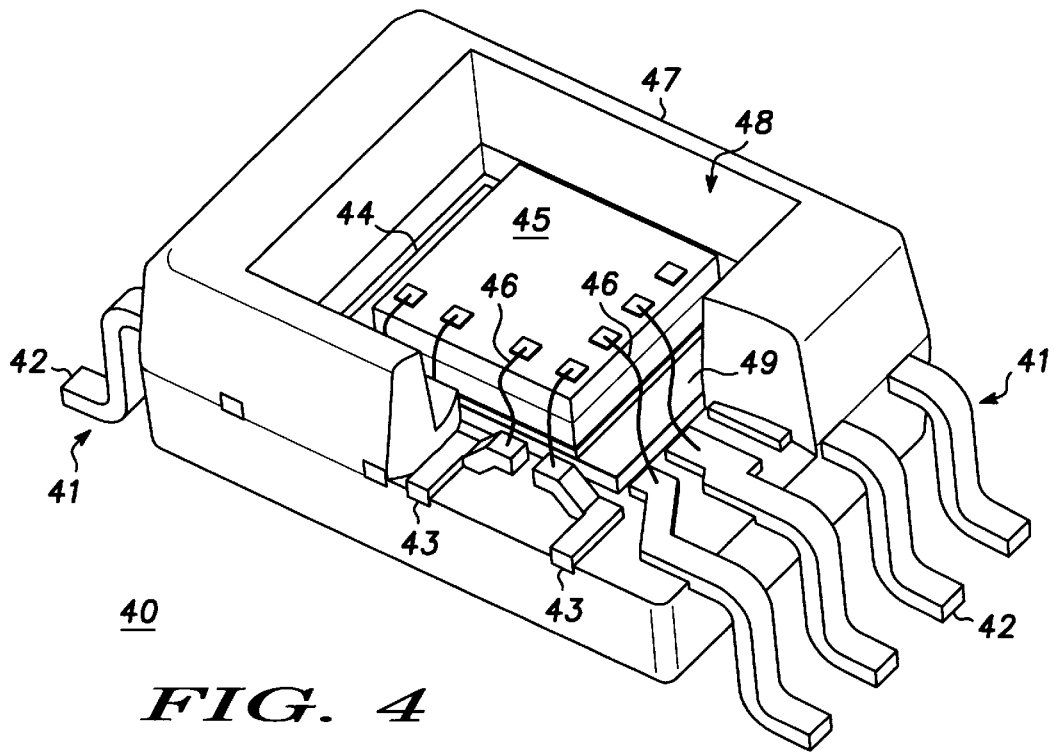
FIG. 4 represents a cut-away isometric top view of an alternative embodiment of the semiconductor component in accordance with the present invention.
Figure 5:
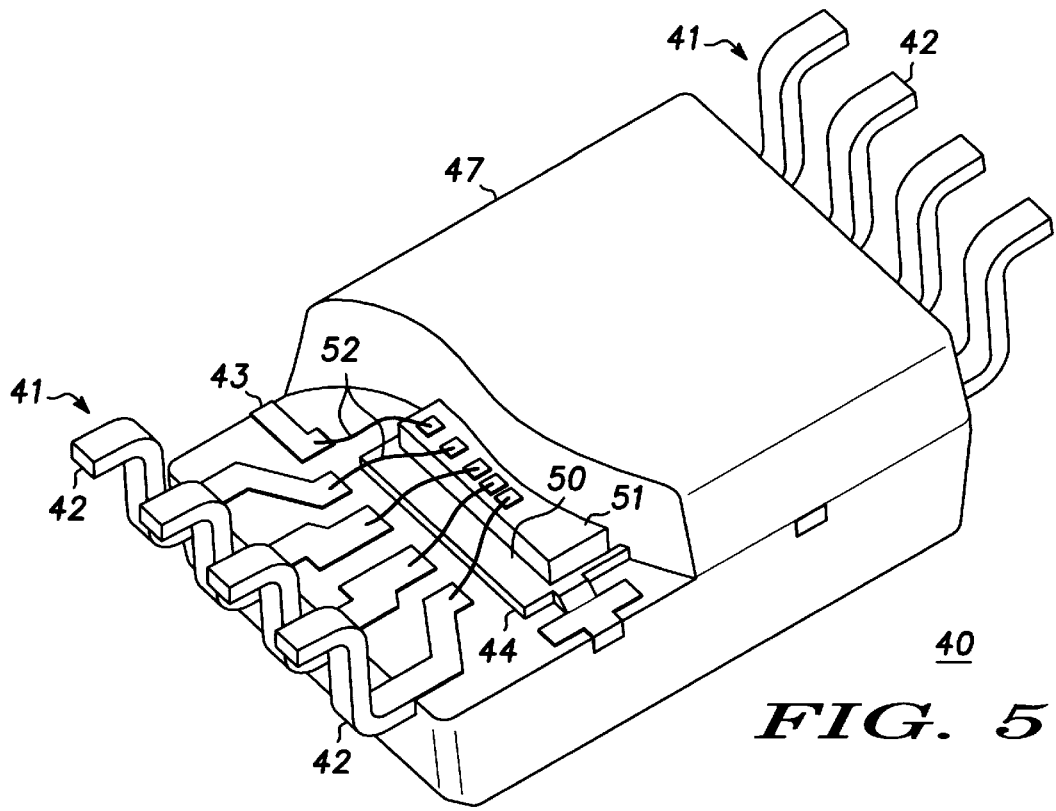
FIG. 5 illustrates a cut-away isometric bottom view of the alternative embodiment of the semiconductor component in accordance with the present invention.

FIG. 4 represents a cut-away isometric top view of a semiconductor component 40, which is an alternative embodiment of semiconductor component 20 in FIGS. 2 and 3. FIG. 5 illustrates a cut-away isometric bottom view of semiconductor component 40.

Component 40 includes a leadframe 41, electronic components 45 (in FIG. 4) and 51 (in FIG. 5), and a packaging material 47. Leadframe 41 can be similar to leadframe 10 of FIG. 1 and includes external leads 42, internal leads 43, and a portion or flag 44. Internal leads 43 can be similar to internal leads 13 and 14 of FIG. 1. Flag 44 has a top surface 49 (in FIG. 4) and a bottom surface 50 (in FIG. 5). Components 45 and 51 are similar to components 30 and 21, respectively, of FIG. 3. After component 51 is disposed, aligned, or mounted over surface 50 of flag 44, wire bonds 52 can be used to electrically couple component 51 to external leads 42 and internal leads 43.

Then, packaging material 47 can be molded around component 51 and leadframe 41. Material 47 is similar to material 23 of FIGS. 2 and 3. Material 47 includes a recess 48, which can expose surface 49 of flag 44 and internal leads 43. Electronic component 45 is disposed, aligned, or mounted in recess 48 and is mounted on surface 49 of flag 44 to overlie component 51. In an alternative embodiment, component 45 can be offset from component 51 instead of overlying component 51.

Wire bonds 46 electrically couple component 45 to external leads 42 and internal leads 43. Wire bonds 46 and 52 are attached to opposite surfaces of leads 42 and 43. As suggest earlier, a TAB or flip-chip scheme can be used in place of wire bonds 46 and 52. Although not illustrated in FIG. 4, a cap similar to cap 32 of FIG. 3 is used to cover recess 48. The dam bar (not illustrated) of leadframe 41 is subsequently excised, and external leads 42 are bent.

In component 40, component 51 includes an integrated circuit that controls component 45 and provides increased sensor functionality and accuracy. Wire bonds 46 and 52 and leads 42 and 43 can be used to electrically couple together components 45 and 51.

Figure 6:
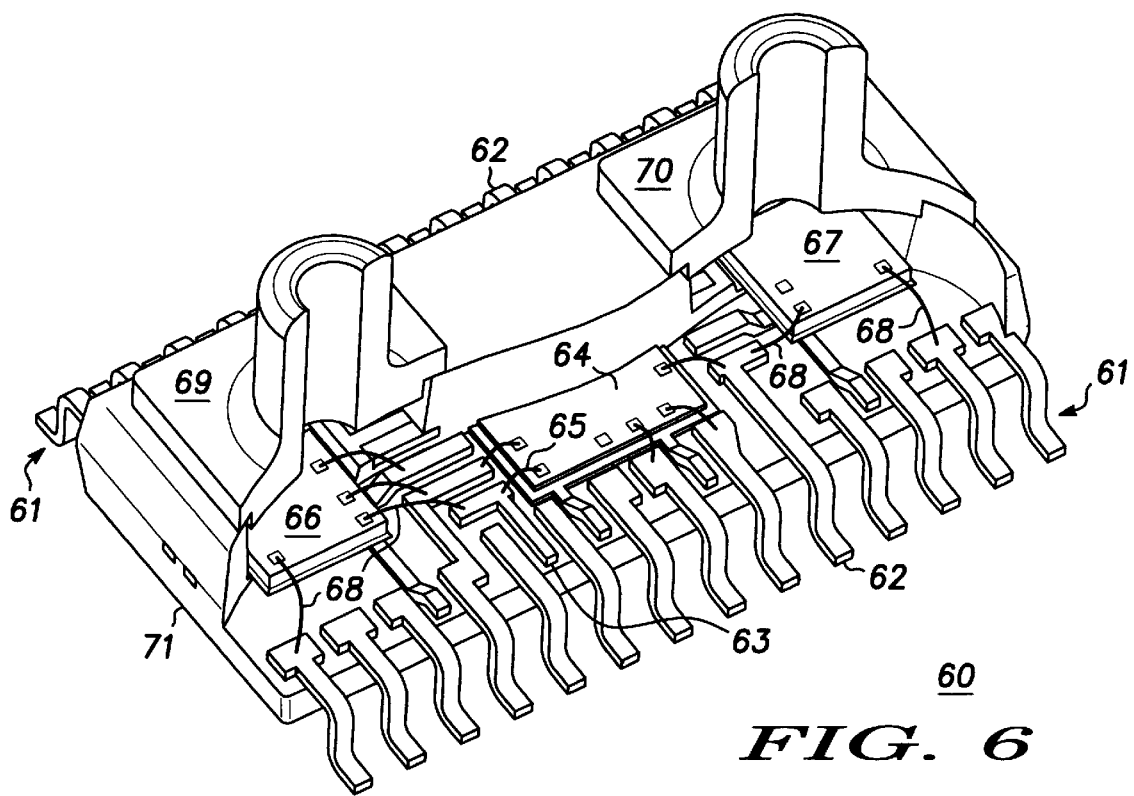
FIG. 6 illustrates a cut-away isometric view of another alternative embodiment of the semiconductor component in accordance with the present invention.

FIG. 6 illustrates a cut-away isometric view of a semiconductor component 60, which is another alternative embodiment of semiconductor component 20 in FIGS. 2 and 3. Component 60 includes a leadframe 61, which is similar to leadframe 10 of FIG. 1. Leadframe 61 includes external leads 62 and internal leads 63. Leads 63 are similar to leads 13 and 14 of FIG. 1. Electronic component 64, which is similar to component 21 of FIG. 2, is disposed, aligned, or mounted over a central portion of leadframe 61. Wire bonds 65 electrically couple component 64 to leads 62 and 63 of leadframe 61. A packaging material 71, which is similar to material 23 of FIG. 2, is molded around component 64 and leadframe 61. Material 71 includes recesses in which electronic components 66 and 67 are disposed, aligned, or mounted. Electronic components 66 and 67 are similar to component 30 of FIG. 3. Wire bonds 68 electrically couple components 66 and 67 to leads 62 and 63 of leadframe 61. Then, caps 69 and 70, which are similar to cap 32 of FIG. 3, are disposed over components 66 and 67, respectively. To facilitate manufacturing, caps 69 and 70 preferably do not overlie component 64, which is preferably kept out from under caps 69 and 70.

In component 60, component 64 includes an integrated circuit that is used to control both components 66 and 67 and to provide increased sensor functionality and accuracy. Wire bonds 65 and 68 and leads 62 and 63 can be used to electrically couple component 64 to components 66 and 67. As an example, component 60 can be a differential pressure sensor, a two-dimensional accelerometer, a chemical sensor capable of simultaneously detecting two different chemicals, or the like.

One skilled in the art will understand that component 60 can also include additional electronic components mounted over a surface of leadframe 61 that is opposite the surface supporting components 64, 66, and 67. Additionally, one skilled in the art will also understand that component 20 in FIGS. 2 and 3 can be similarly modified. Furthermore, one skilled in the art will further understand that component 40 in FIGS. 4 and 5 can have more than one component mounted over each side of leadframe 41.

Therefore, it is apparent there has been provided an improved semiconductor component that overcomes the disadvantages of the prior art. The semiconductor component provides improved sensor functionality, reliability, manufacturability, and safety.

We claim:

1. A method of making an semiconductor component comprising:

providing a leadframe having a die flag, an interior lead, and a plurality of exterior leads, the interior lead electrically shorted to the plurality of exterior leads;

mounting a semiconductor chip over the die flag;

wire bonding the semiconductor chip to the interior lead and to the plurality of exterior leads;

disposing an encapsulant around the semiconductor chip and the leadframe after wire bonding the semiconductor chip, a first portion of the interior lead and first portions of the plurality of exterior leads extending beyond a perimeter of the encapsulant, the encapsulant having a recess exposing a second portion of the interior lead and second portions of the plurality of exterior leads;

mounting an electronic chip in the recess;

wire bonding the electronic chip to the second portion of the interior lead and to the second portions of the plurality of exterior leads after disposing the encapsulant; and excising the first portion of the interior lead from the semiconductor component to electrically isolate the interior lead from the plurality of exterior leads.

2. The method of claim 1 further comprising disposing a cap over the recess and the electronic chip after wire bonding the electronic chip.

3. The method of claim 2 wherein the step of disposing the cap further comprises keeping the semiconductor chip out from under the cap.

4. The method of claim 1 wherein mounting the semiconductor chip further comprises providing an integrated circuit for the semiconductor chip and wherein the step of mounting the electronic chip further comprises providing a sensor for the electronic chip.

5. The method of claim 1 wherein mounting the electronic chip further comprises mounting the electronic chip over a flag-less portion of the leadframe.

6. The method of claim 1 wherein excising the first portion of the interior lead occurs after wire bonding the electronic chip.

* * * * *